United States Patent
Tanaka et al.

(10) Patent No.: US 6,338,979 B1
(45) Date of Patent: Jan. 15, 2002

(54) METHOD OF MANUFACTURING ORGANIC EL DEVICE

(75) Inventors: Haruo Tanaka; Mitsuru Morimoto, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/432,570

(22) Filed: Nov. 12, 1999

(30) Foreign Application Priority Data

Nov. 13, 1998 (JP) .......................................... 10-323041

(51) Int. Cl.⁷ .............................................. H01L 50/40
(52) U.S. Cl. ............................. 438/99; 438/99; 438/82; 257/40; 118/715
(58) Field of Search ....................... 438/99, 82; 257/40; 118/715; 427/532–36

(56) References Cited

U.S. PATENT DOCUMENTS

| | | | | |
|---|---|---|---|---|
| 5,276,380 A | * | 1/1994 | Tang | 313/504 |
| 5,399,936 A | * | 3/1995 | Namiki et al. | 313/504 |
| 5,427,858 A | * | 6/1995 | Nakamura et al. | 428/421 |
| 5,478,780 A | * | 12/1995 | Koerner et al. | 437/190 |
| 5,652,067 A | * | 7/1997 | Ito et al. | 428/690 |
| 5,688,551 A | * | 11/1997 | Littman et al. | 427/64 |
| 5,693,428 A | * | 12/1997 | Fujii et al. | 428/690 |
| 5,747,930 A | * | 5/1998 | Utsugi | 313/504 |
| 5,814,935 A | * | 9/1998 | Ujihara | 313/504 |
| 5,818,068 A | * | 10/1998 | Sasaki et al. | 257/59 |
| 5,834,894 A | * | 11/1998 | Shirasaki et al. | 313/509 |
| 5,855,994 A | * | 1/1999 | Biebuyck et al. | 428/209 |
| 6,072,450 A | * | 6/2000 | Yamada et al. | 345/76 |

OTHER PUBLICATIONS

D. Monarchie et al. "Sunlight viewable EL displays for Military application" IEEE AES Systems Magazine Aug. 1995. p. 21–25.*

K. Miyairi "the effect of electrode materials on carrier injection into the organic electrodeluminescence device". 1995 IEEE 5th Internat. Conference on Conduction and breakdown in solid dielectrics 0–78–3–2040–9/95 p. 129–133.*

A. Bolozdynya et al. "Multilayer EL camera: Concept and Monte Carlo Study" IEEE Trans. on nuclear science vol. 45 No. 3 6/98 0018–9499/98 p. 1646–1655.*

* cited by examiner

*Primary Examiner*—Caridad Everhart
*Assistant Examiner*—Granvill D Lee, Jr.
(74) *Attorney, Agent, or Firm*—Morgan, Lewis & Bockius LLP

(57) ABSTRACT

In a method of manufacturing an organic EL device, an ITO transparent electrode 11, organic layer 12 and upper electrode 13 are formed in a vacuum on a glass substrate 2. They are sealed in a nitrogen atmosphere by a sealant. Since they can be formed in an environment not exposed to the outside air, it is possible to prevent impurities from being applied to the ITO transparent electrode 11, thereby a highly reliable organic EL device.

10 Claims, 3 Drawing Sheets

METHOD OF MANUFACTURING ORGANIC EL DEVICE

BACKGROUND OF THE INVENTION

1. Field of the Invention

The present invention relates to a method for manufacturing an organic EL device, and more particularly to a method for an organic EL device in a preferred environment in which respective manufacturing steps are executed.

2. Description of the Related Art

FIG. 2 is a perspective view of a conventional EL display panel 25 provided with an organic EL device. In the EL display panel 25, a plurality of strip-shaped transparent electrodes 11 of ITO (Indium Tin Oxide) (hereinafter referred to as ITO transparent electrodes) are arranged on a glass substrate 2 in a direction of arrow 93. Above the ITO transparent electrodes, a plurality of strip-shaped organic layers 12 are arranged in a direction of arrow 94.

A plurality of strip-shaped upper electrodes 13 made of metal film patterns such as Al, Mg, Ag etc are superposed on the organic layers 12, respectively. The ITO transparent electrodes 11, organic EL layers 12 and upper electrodes 13 are covered with a sealant (not shown) on the glass substrate 2. The internal space of the sealant is filled with nitrogen.

In the EL display panel 25, when a voltage is applied between a prescribed ITO transparent electrode 11 and a prescribed upper electrode 13, an organic EL layer 12 located at an area where these electrodes cross is activated by the voltage emits light. Therefore, by controlling selection of each ITO transparent electrode 11 and each upper electrode 13, a desired display can be realized using the EL display panel 25.

An explanation will be given of a method of manufacturing such a conventional organic EL device. Generally, a glass substrate 2 coated with ITO is prepared. The glass substrate 2 is etched through a mask pattern of photoresist to form the ITO transparent electrode 11 having a prescribed pattern. With the glass substrate 2 with the ITO transparent electrode formed thereon being placed in a vacuum, the organic layer 12 and upper electrode 13 are formed by the vacuum evaporation technique. Thereafter, they are sealed by the sealant secured to the glass substrate 2 in a nitrogen atmosphere. In this way, the organic layer 12 and upper electrode 13 are formed in a vacuum and sealed in the nitrogen atmosphere, thus preventing moisture from intruding into the inner space of the sealant.

However, the conventional method of manufacturing an organic EL device is accompanied by deposition of some impurities to the ITO transparent electrode. Specifically, since the ITO transparent electrode 11 is formed through the etching using photoresist, with the impurities such as water and so on, being applied to the surface of the ITO transparent electrode 11, the organic layer 12 is formed on the ITO transparent electrode 11.

Generally, deposition of impurities on the ITO transparent electrode 11 changes a potential at the surface of the ITO transparent electrode 11 to vary a device characteristic. Unlike an inorganic EL device which operates at a high voltage of e.g. 100 V, the organic EL device can operate at a low voltage of several volts. Therefore, if the device characteristic varies and incorrect operation is easy to be generated because of a slight change in the potential at the surface of the ITO transparent electrode 11, an expected correct operation of the organic EL device cannot be realized. This largely attenuates reliability of the organic EL device.

SUMMARY OF THE INVENTION

An object of the present invention is to provide an organic EL device with improved reliability.

In order to attain the above object, in accordance with a first aspect of the present invention, there is provided a method of manufacturing an organic EL device comprising the steps of: forming a lower electrode formed on a substrate; forming an organic EL layer formed on the lower electrode; and forming a upper electrode formed on the organic EL layer; wherein at least the step of forming the lower electrode is executed in an environment not exposed to the outside air or in a vacuum.

In this configuration, it is possible to prevent impurities from being applied to the lower electrode so that changes of the characteristic of the EL element can be avoided, thereby improving the reliability of the organic EL device.

A second aspect of the method is a method according to the first aspect, wherein all these steps are executed in an environment not exposed to the outside air.

In this configuration, since all the above steps are executed in an environment not exposed to the outside air, it is possible to prevent impurities impeding the operation of the device from being applied to the respective layers so that changes of the characteristic of the EL device can be avoided, thereby providing a highly reliable organic EL device. Particularly, this prevents the impurities from being applied to the ITO transparent electrode so that changes of the characteristic of the EL display panel can be avoided and change of a stationary state can be reduced, thereby the reliability and reappearance of the organic EL device are improved.

A third aspect of the method is a method according to the first aspect, wherein all these steps are executed in a vacuum.

In this configuration, it is possible to prevent impurities impeding the operation of the device from being applied to the respective layers so that changes of the characteristic of the EL device can be avoided, thereby providing a highly reliable organic EL device. Particularly, this prevents the impurities from being applied to the ITO transparent electrode so that changes of the characteristic of the EL display panel can be avoided, thereby improving the reliability of the organic EL device.

The fourth aspect, in a method of manufacturing an organic EL device according to the second aspect, is characterized in that said lower and upper electrodes are formed in stripe patterns which are apart from one another so that a large number of organic EL devices are arranged in a matrix. In this configuration, the organic EL panel having a device characteristic with no variation can be manufactured.

The fifth aspect, in a method of manufacturing an organic EL device according to the second aspect, is characterized in that the step of forming the lower electrode is to form an electrode pattern of ITO (indium-tin-oxide) on a glass substrate. The characteristic of the organic EL device varies greatly depending on the surface state of ITO. However, in accordance with the method of the present invention, the layer is deposited without being exposed to outside air so that it possible to prevent stain or humidity from being applied on the surface of ITO, thus providing a highly reliable organic EL device.

The sixth aspect, in a method of manufacturing an organic EL device according to the first aspect, is characterized in that the step of making said lower electrode is performed by a vacuum evaporation through a mask a the substrate. In this method, evaporation in carried out through a shadow mask of e.g. metal so that a desired thin film can be formed. In addition, a pattern of the lower electrode with a gently-sloping edge can be obtained so that concentration of an electric field can be prevented. This permits the life of the device to be lengthened.

The seventh aspect, in a method of manufacturing an organic EL device according to the sixth aspect, is characterized in that the step of making said organic EL layer in performed by a vacuum evaporation through a mask on the substrate.

The eighth aspect, in a method of manufacturing an organic EL device according to the seventh aspect, in characterized in that the step of making said upper electrode is performed by a vacuum evaporation through a mask on the substrate. In this method, evaporation is carried out through a shadow mask of e.g. metal so that a desired thin film can be formed. In addition, a pattern of the upper electrode with a gently-sloping edge can be obtained.

The ninth aspect, in a method of manufacturing an organic EL device defined in the first aspect, the steps of forming said lower electrode, organic EL layer and upper electrode are successively performed by selectively activating evaporation sources in the same deposition chamber. According to this method, deposition can be continuously carried out in a state where the substrate and evaporation source are at a standstill. Thus, the clean surface state of the substrate can be maintained to form respective film with good quality.

The tenth aspect, in a method of manufacturing an organic EL device defined in the first aspect, is characterized in that the steps of forming the lower electrode, organic EL layer and upper electrode include the step of transporting the substrate into deposition chambers, respectively without being exposed to outside air. This method permits the film deposition to be carried out successively and effectively.

The eleventh aspect, in a method of manufacturing an organic EL device defined in the first aspect, is characterized in that the steps of forming the lower electrode, organic EL layer and upper electrode include the step of successively transporting the corresponding evaporation source to the substrate. Thus, only the evaporation source moves with the substrate being at a standstill so that the substrate is maintained in a stable state to prevent impurities from being applied to the substrate.

The twelfth aspect, in a method of manufacturing an organic EL device defined in the eleventh aspect, is characterized in that the substrate is located at a higher position than the evaporation source in a reactive chamber. Thus, impurities applied to the evaporation source do not fall onto the substrate, thus providing the preferable surface state of the substrate.

The above and other objects and features of the present invention will be more apparent from the following description taken in conjunction with the accompanying drawings.

DESCRIPTION OF THE PREFERRED EMBODIMENTS

Figure 1A:
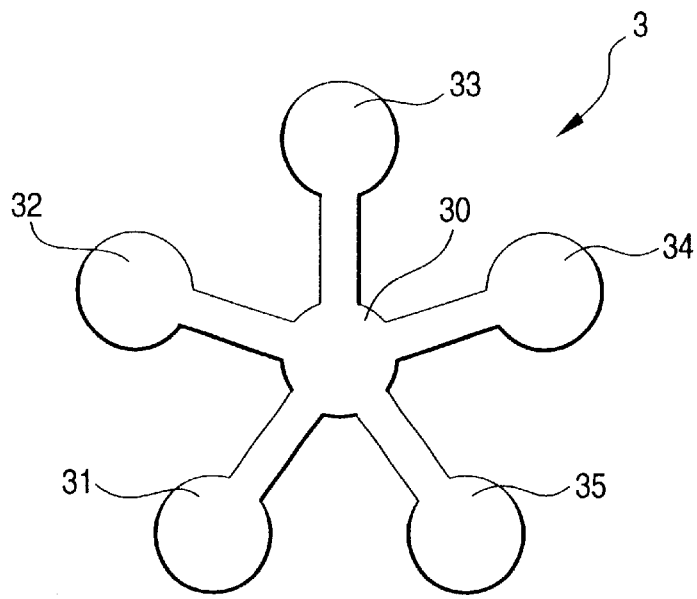
FIG. 1A is a conceptual plan view of a processing apparatus used to manufacture an EL display panel 25 in a method of manufacturing an organic EL device according to an embodiment of the present invention.
Figure 1B:
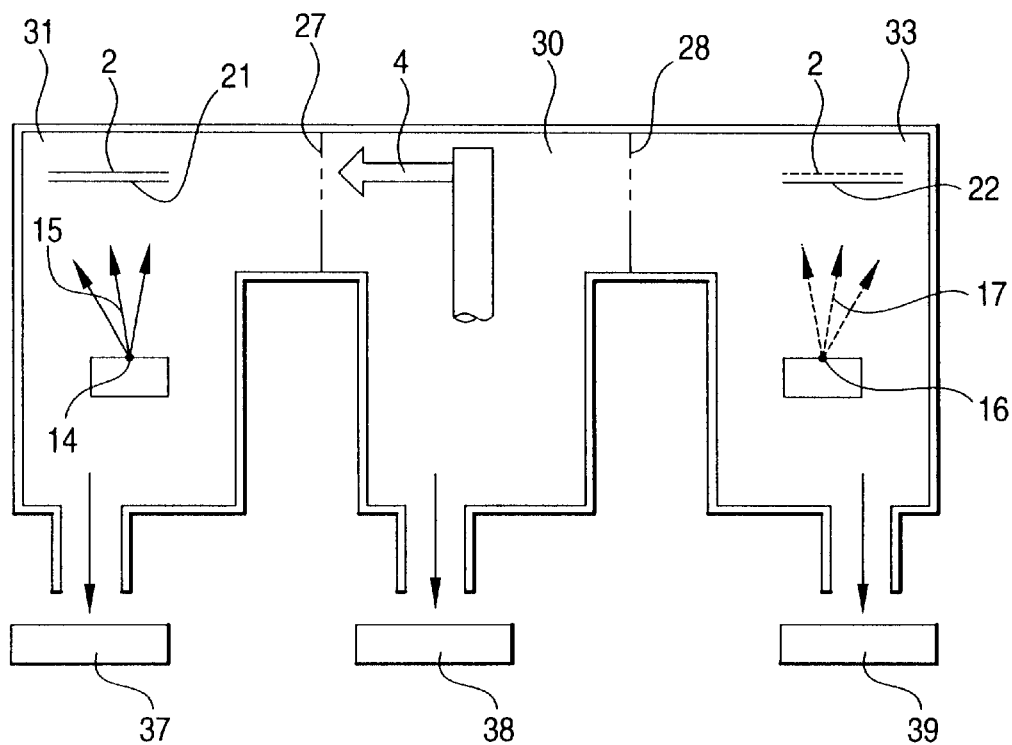
FIG. 1B is a side sectional view of the processing apparatus of FIG. 1.
Figure 2:
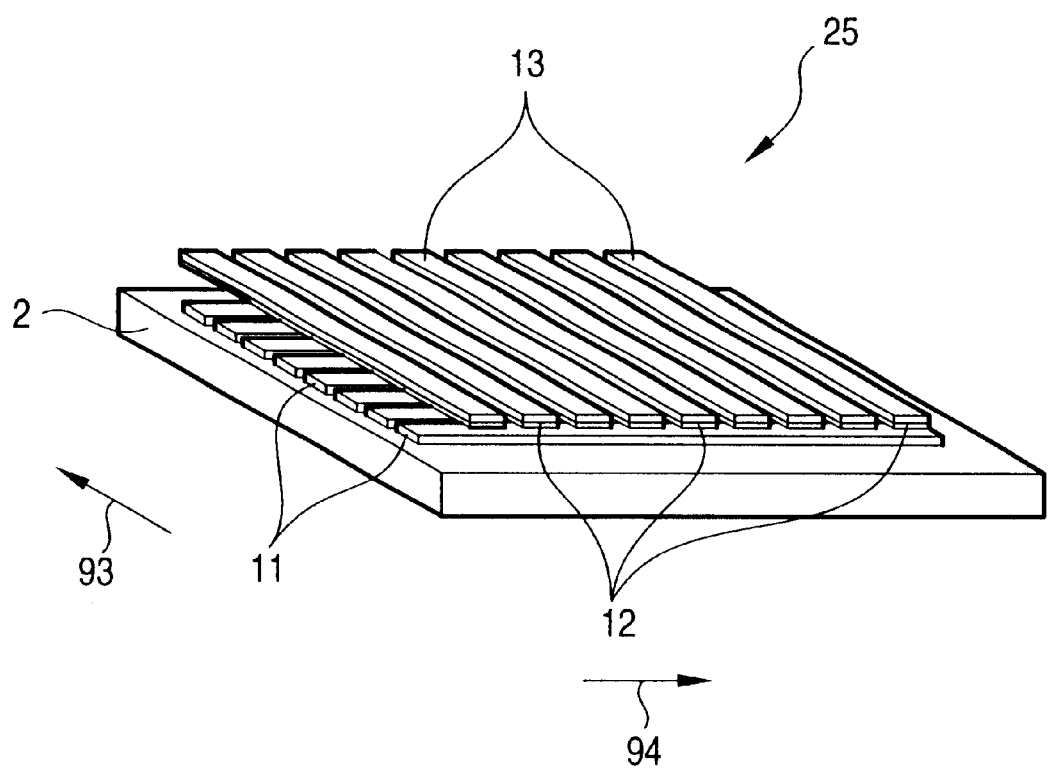
FIG. 2 is a perspective view of the EL display panel 25 using an organic EL device.

An explanation will be given of an embodiment of the method for manufacturing an organic EL device according to the present invention taking an EL display panel of an EL display as an example. FIG. 1A is a conceptual plan view of a processing apparatus 3 used in this embodiment and FIG. 1B is a side sectional view of the processing device. FIG. 2 is a perspective view of the EL display panel 25.

As seen from FIG. 2, in the EL display panel 25, a plurality of strip-shaped transparent electrodes 11 of ITO (Indium Tin Oxide) are arranged on a glass substrate 2 in a direction of arrow 93. Above the transparent electrodes of ITO, a plurality of strip-shaped organic layers 12 are arranged in a direction of arrow 94 which is on the plane to which the direction of arrow 93 belongs to and which is orthogonal to the arrow 93. A plurality of strip-shaped upper electrodes 13 are superposed on the organic layers 12, respectively.

Figure 3:
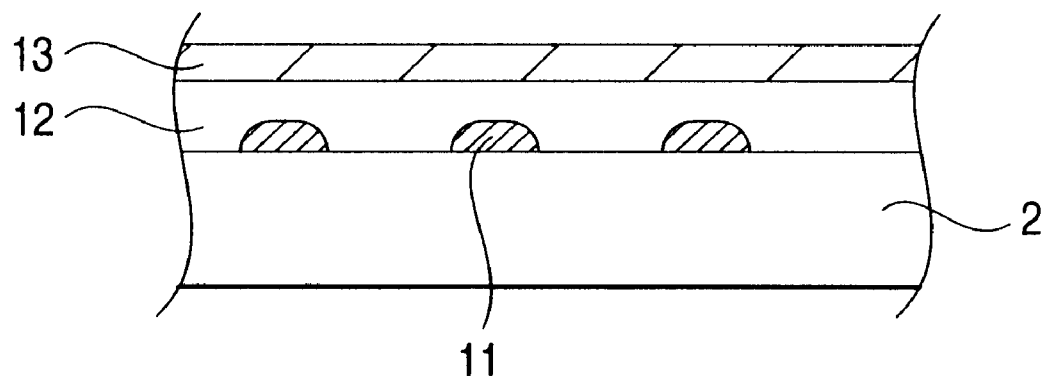
FIG. 3 is a sectional view of an EL display panel with the organic EL devices manufactured by the method according to the present invention.
Figure 4:
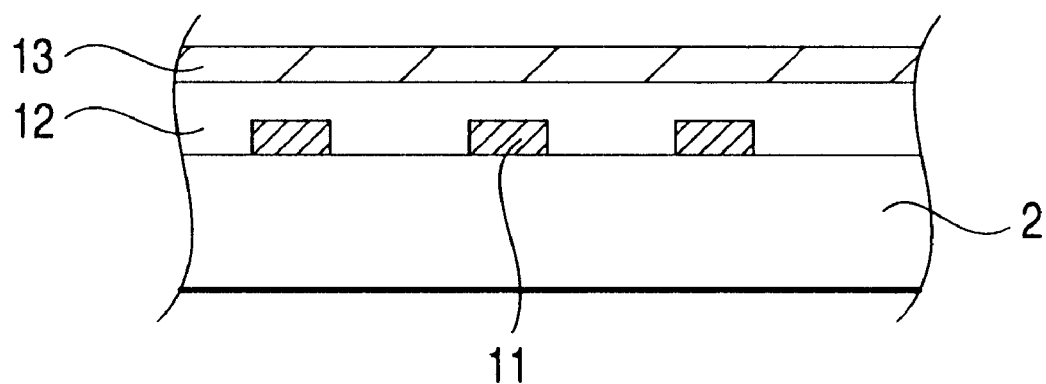
FIG. 4 is a sectional view of an EL display panel with the organic EL devices manufactured by the method according to a prior art.

FIGS. 3 and 4 schematically show the transparent ITO electrodes 11 serving as lower electrodes arranged on a glass substrate 2, organic layers 12 serving as organic EL layers, and upper electrodes 13 serving as upper electrodes. Actually, a large number of minute ITO transparent electrodes 11, organic layers 12 and upper electrodes 13 are arranged on the glass substrate 2. In this embodiment, the lower electrode is anode electrode and the upper electrode is cathode electrode.

In the EL display panel 25, when a voltage is applied between a prescribed ITO transparent electrode 11 and a prescribed upper electrode 13, an organic EL layer 12 located at an area where these electrodes cross emits light. Therefore, by controlling selection of each ITO transparent electrode 11 and each upper electrode 13, a desired display can be realized using the EL display panel 25.

An explanation will be given of a method of manufacturing an EL display panel 25 in this embodiment.

As seen from FIG. 1A, a processing apparatus 3 includes a transfer chamber 30, an ITO transparent electrode forming chamber 31, a previous processing chamber 32, an organic layer forming chamber 33, an upper electrode forming chamber 34 and a sealing chamber 35.

A gate capable of opening/closing is located between the respective chambers so that passing or separating of the respective chambers can be selected by opening or closing of the gate. A vacuum pump is connected to each chamber so that the interior of the chamber can be placed in a vacuum state. FIG. 1B shows the transfer chamber 30, ITO transparent electrode forming chamber 31 and organic layer forming chamber 33. The respective chambers are provided with vacuum pumps 37, 38 and 39 and partitioned by gates 27 and 28 capable of opening/closing.

In the manufacture of the EL display panel 25, the glass substrate 2 is housed in the ITO transparent electrode forming chamber 31. The vacuum pumps are driven to produce a vacuum in the transfer chamber 30, ITO transparent electrode forming chamber 31, previous processing chamber 32, organic layer forming chamber 33, and upper electrode forming chamber 34. Within the ITO transparent electrode forming chamber 31, a shadow mask 21 is arranged in the vicinity of or in contact with the glass substrate 2. The shadow mask 21 has a pattern of the ITO transparent electrode 11.

Atoms 15 for deposition are evaporated from an evaporation source 14 placed in the ITO transparent electrode forming chamber 31, and deposited on the glass substrate 2 through the shadow mask 21. Thus, the ITO transparent electrode 11 (FIG. 2) having a prescribed pattern is formed on the glass substrate 2.

The glass substrate 2 is transferred from the ITO transparent electrode forming chamber 31 into the previous processing chamber 32 through the transfer chamber 30. As seen from FIG. 1B, a transfer arm 4 is placed within the transfer chamber 30. The transfer arm 4 is provided with a grasping portion at its tip and is extendable. In order to transfer the glass substrate 2, the transfer arm 4 within the transfer chamber 30 extends to grasp the glass substrate 2 within the ITO transparent electrode chamber 31 so that the glass substrate 2 is once introduced into the transfer chamber 30. Thereafter, the transfer arm 4 changes its direction and extends to house the glass substrate 2 into the previous processing chamber 32.

As described above, at this time, the inside of the transfer chamber 30 and previous processing chamber 32 has already been placed in the vacuum state. Therefore, the glass substrate 2 with the ITO transparent electrode 11 is not exposed to the outside air. Within the previous processing chamber 32, in order to obtain an optimum operation of the EL display panel 25, the glass substrate 2 is subjected to the previous processing such as argon plasma processing, oxygen plasma processing, etc. Thus, the surface condition of the ITO transparent electrode 11 is made ready for the next step.

Thereafter, the transfer arm 4 within the transfer chamber 30 transfers the glass substrate 2 with the ITO transparent electrode 11 to the organic layer forming chamber 33 and set it at a prescribed position therein. Within the organic layer forming chamber 33 also, like with the ITO transparent electrode forming chamber 31, a shadow mask 22 is arranged in the vicinity of or in contact with the glass substrate 2 set at the prescribed position. The shadow mask 22 has a pattern of the organic layer 12.

Atoms 17 for deposition are evaporated from an evaporation source 16 placed in the organic layer forming chamber 33, and applied to the glass substrate 2 and the ITO transparent electrode 11 through the shadow mask 22. Thus, the organic layer 12 (FIG. 2) having a prescribed pattern is formed on the glass substrate 2.

In order to transfer the glass substrate 2 with the ITO transparent electrode 11 and organic layer 12, the transfer arm 4 within the transfer chamber 30 extends to grasp the glass substrate 2 and set it into the upper electrode forming chamber 34 at a prescribed position therein via the transfer chamber 30. Within upper electrode forming chamber 34 also, like within the organic layer forming chamber 33, a shadow mask is arranged in the vicinity of or in contact with the glass substrate 2 set at the prescribed position. The shadow mask has a pattern of the upper electrode 13. Atoms for deposition are evaporated from an evaporation source placed in the upper electrode forming chamber 34, and applied to the glass substrate 2 through the shadow mask to form the upper electrode 13 on the organic layer 12.

Thus, the ITO transparent electrodes 11, organic layers 12 and upper electrode 13 are formed on the glass substrate 2 as shown in FIG. 2. The transfer arm 4 transfers the glass substrate 2 and set it in the sealing chamber 35. FIG. 3 is a sectional view of an EL display panel with the organic EL devices manufactured by the method according to this embodiment.

At this time, the inside of the sealing chamber 35 is filled with nitrogen. Within the sealing chamber 35, a sealant (not shown) such as a glass cap or metallic cap is attached to the glass substrate 2. Thus, the ITO transparent electrode 11, organic layer 12 and upper electrode 13 are sealed on the glass substrate 2. The sealant is bonded and secured to the glass substrate 2 by means of epoxy resin, ultraviolet ray setting resin, etc.

The sealing step is carried out within the nitrogen atmosphere so that the ITO transparent electrode 11, organic layer 12 and upper electrode 13 are sealed on the glass substrate 2. In this case, since the inside of the sealant is filled with nitrogen, it is not necessary to fill the inside of the sealant with nitrogen again. This permits to reduce the step for this purpose to improve the efficiency of manufacture.

As described above, the steps of forming the ITO transparent electrode 11, organic layer 12, upper electrode 13 are executed in a vacuum and within an environment not exposed to the outside air. This prevents impurities impeding the operation of the display panel 25 from being applied to the respective layers so that changes of the characteristic of the EL display panel 25 can be avoided, thereby providing a reliable organic EL device. Particularly, this prevents the impurities from being applied to the ITO transparent electrode so that changes of the characteristic of the EL display panel 25 can be avoided, thereby providing the reliable organic EL device.

In the method described above, the electrode pattern is formed not by etching through photolithography but using a shadow mask. Therefore, as seen from FIG. 3, the pattern edge of the ITO transparent electrode 11 has a gentle slope. In contrast, the electrode pattern formed by the prior art, which is formed by etching through the photolithography using a resist pattern as a mask, has a shape edge as seen from FIG. 4. Therefore, an electric field will be concentrated at the shape edge of the ITO transparent electrode 11. On the other hand, the pattern evaporation using the shadow mask in the same chamber according to the present invention will provide a gently sloping sectional shape of the ITO electrode. Therefore, in accordance with the present invention, concentration of the electric field at the electrode edge can be relaxed, thereby lengthening the life of the organic EL device.

If the shadow mask is made proximate to the substrate in a non-contact state, the substrate surface can be prevented from being polluted owing to the contact of the shadow mask. If the shadow mask is brought into contact with the substrate, inert gas at a high pressure is sprayed to clean the surface, thereby providing a preferable interface state.

In the processing apparatus 3, particles for evaporation are evaporated from the evaporation source arranged on the lower side. Therefore, the unnecessary remaining particles which have not been deposited on the substrate will not fall onto the substrate. In addition, when the evaporation source is installed, the substrate will not be polluted, thereby obtaining the cleaner interface state.

Prior to forming a subsequent film after the individual films have been formed, in order to clean the surface, an isolated region for replacing the atmosphere may be provided.

In the embodiment described above, the lower electrode was made of ITO, and the upper electrode was made of metal. However, the present invention can be applied to the organic EL device in which a metallic electrode such as Al, Mg, Ag etc is formed on the substrate, an organic EL layer is formed thereon and a transparent electrode pattern such as an ITO electrode pattern is finally formed by the vacuum evaporation. The organic EL layer may be integrally formed or to form patterns.

Further, in the embodiment described above, in order to form the individual layers, the substrate to be processed was successively transported into the respective processing chambers. However, they may be formed by successively changing the evaporation sources in the same chamber.

The method of manufacturing an organic EL device according to the present invention should not be limited to the embodiment as described above. For example, although the organic layer 12 was formed in a vacuum, it may be in a nitrogen atmosphere. Namely, the ITO transparent electrode 11 and upper electrode 13 are formed in a vacuum and the organic layer 12 is formed in the nitrogen atmosphere. Thereafter, these layers are sealed in the nitrogen atmosphere. In this case, the organic layer 12 may be formed by spin coating.

In the embodiment described above, although the ITO transparent electrode 11, organic layer 12 and upper electrode 13 were formed by the vacuum evaporation, they may be formed by sputtering. Although the embodiment was described taking a monochromatic EL display panel 25 as an example, the present invention can be applied to a color EL display panel.

What is claimed is:

1. A method of manufacturing an organic EL device comprising the steps of:

forming a vacuum in a plurality of chambers;

housing a glass substrate in a first chamber of said plurality of chambers;

arranging a mask in the vicinity of the glass substrate within the first chamber of said plurality of chambers;

forming a lower electrode on the glass substrate;

transferring the glass substrate from the first chamber of said plurality of chambers to a second chamber of said plurality of chambers;

processing the glass substrate in the second chamber of said plurality of chambers;

transferring the glass substrate from the second chamber of said plurality of chambers to a third chamber of said plurality of chambers;

arranging a mask in the vicinity of the glass substrate within the third chamber of said plurality of chambers;

forming an organic EL layer on the lower electrode;

transferring the glass substrate from the third chamber of said plurality of chambers to a fourth chamber of said plurality of chambers;

arranging a mask in the vicinity of the glass substrate within the fourth chamber of said plurality of chambers;

forming an upper electrode on the organic EL layer;

transferring the glass substrate from the fourth chamber of said plurality of chambers to a fifth chamber of said plurality of chambers; and sealing the glass substrate.

2. A method of manufacturing an organic EL device according to claim 1, wherein said lower and upper electrodes are formed in stripe patterns which are apart from one another so that a large number of organic EL devices are arranged in a matrix.

3. A method of manufacturing an organic EL device according to claim 1, wherein the step of forming the lower electrode is to form an electrode pattern of ITO (indium-tin-oxide) on a glass substrate.

4. A method of manufacturing an organic EL device according to claim 1, wherein the step of making said lower electrode is performed by a vacuum evaporation.

5. A method of manufacturing an organic EL device according to claim 1, wherein the step of making said organic EL layer is performed by a vacuum evaporation.

6. A method of manufacturing an organic EL device according to claim 1, wherein the step of making said upper electrode is performed by a vacuum evaporation.

7. A method of manufacturing an organic EL device according to claim 1, wherein the steps of forming said lower electrode, organic EL layer and upper electrode are successively performed by selectively activating evaporation sources in a same deposition chamber.

8. A method of manufacturing an organic EL device according to claim 1, wherein the steps of forming the lower electrode, organic EL layer and upper electrode include the step of transporting the substrate into deposition chambers, respectively without being exposed to outside air.

9. A method of manufacturing an organic EL device according to claim 1, wherein the steps of forming the lower electrode, organic EL layer and upper electrode include the step of successively transporting a corresponding evaporation source to the substrate.

10. A method of manufacturing an organic EL device according to claim 1, wherein the substrate is located at a higher position than an evaporation source in a deposition chamber.

* * * * *